United States Patent [19]

Mansuria et al.

[11] Patent Number: 5,012,325
[45] Date of Patent: Apr. 30, 1991

[54] THEROMELECTRIC COOLING VIA ELECTRICAL CONNECTIONS

[75] Inventors: Mohanlal S. Mansuria, Coral Springs; Joseph M. Mosley, Boca Raton; Richard D. Musa, Boca Raton; Vito J. Tuozzolo, Boca Raton, all of Fla.

[73] Assignee: International Business Machines Corp., Armonk, N.Y.

[21] Appl. No.: 513,655

[22] Filed: Apr. 24, 1990

[51] Int. Cl.⁵ .............................................. H01L 23/02
[52] U.S. Cl. ........................................ 357/81; 357/87; 361/386; 361/388
[58] Field of Search .......................... 357/51, 81, 87; 307/491; 361/386, 388

[56] References Cited

U.S. PATENT DOCUMENTS

| Re. 27,934 | 3/1974 | Merrin | 317/101 CC |
|---|---|---|---|
| 3,429,040 | 2/1969 | Miller | 29/626 |
| 3,994,277 | 11/1976 | Altman | 126/270 |
| 4,011,104 | 3/1977 | Basiulis | 136/205 |
| 4,034,469 | 7/1977 | Koopman et al. | 29/628 |
| 4,146,902 | 3/1979 | Tanimoto | 357/51 |
| 4,147,040 | 4/1979 | Altman | 62/467 R |
| 4,150,552 | 4/1979 | Altman | 62/467 R |
| 4,155,226 | 5/1979 | Altman | 62/467 R |
| 4,236,126 | 11/1980 | Weller et al. | 307/491 |
| 4,238,759 | 12/1980 | Hunsperger | 357/28 |
| 4,279,292 | 7/1981 | Swichosz | 165/61 |
| 4,297,653 | 10/1981 | Scifres et al. | 331/94.55 |
| 4,338,577 | 7/1982 | Sato et al. | 372/36 |
| 4,399,541 | 8/1983 | Kovats et al. | 372/36 |
| 4,604,753 | 8/1986 | Sawai | 372/36 |
| 4,621,279 | 11/1986 | Maier et al. | 357/83 |
| 4,907,067 | 3/1990 | Dorryberry | 357/80 |
| 4,926,277 | 5/1990 | Jensen | 317/72 |

FOREIGN PATENT DOCUMENTS

| 2542174 | 7/1976 | Fed. Rep. of Germany . |
| 2634274 | 3/1978 | Fed. Rep. of Germany . |
| 2054949 | 2/1981 | United Kingdom . |
| 2112565 | 7/1983 | United Kingdom . |
| 2097184 | 10/1987 | United Kingdom . |

*Primary Examiner*—William D. Larkins
*Assistant Examiner*—Reginald Ratliff
*Attorney, Agent, or Firm*—Stephen A. Terrile

[57] ABSTRACT

A thermoelectrically cooled integrated circuit package is provided which includes a thermally conductive dielectric substrate, an input connecting portion and an output connecting portion supported by the dielectric substrate, and an integrated circuit chip including an input terminal and output terminal. The input terminal is electrically connected to the input connecting portion via a first conductive material, and the output terminal is electrically connected to the output connecting portion via a second conductive material. The first conductive material and the second conductive material thermoelectrically cool the integrated circuit chip when a signal passes through the first conductive material and the second conductive material.

20 Claims, 2 Drawing Sheets

THEROMELECTRIC COOLING VIA ELECTRICAL CONNECTIONS

BACKGROUND OF THE INVENTION

The present invention relates to thermoelectric coolers (TEC's).

It is known to use a thermoelectric cooler to lower the operating temperature of a semiconductor device such as a laser. A thermoelectric cooler includes a plurality of thermoelectric cooling elements, which are constructed of materials with dissimilar characteristics. The elements are connected electrically in series and thermally in parallel to provide a plurality of thermoelectric couples. Each thermoelectric couple includes one element having a first characteristic and another element having a second characteristic. The thermoelectric couples are connected between two plates which function as a hot side and a cold side of a thermoelectric cooler. The hot side is thermally connected to a heat sink and the cold side is thermally connected to the semiconductor device.

Thermoelectric cooling is achieved by passing a DC electric current through the thermoelectric cooler. Thermal energy is drawn from the cold side to the hot side at a rate which is proportional to current passing through the circuit and the number of couples. At the hot side, the thermal energy is dissipated by the heat sink. The thermoelectric cooling effect is greatly increased when the dissimilar conducting materials used are semiconducting materials.

The dissimilar semiconducting materials generally used for thermoelectric cooling are N-type material (more electrons than necessary to complete a perfect molecular lattice structure) and P-type material (fewer electrons than necessary to complete a perfect molecular lattice structure, thus providing holes). The extra electrons in the N-type material and the holes in the P-type material are called "carriers" which function to move the thermal energy from the cold side to the hot side.

SUMMARY OF THE INVENTION

It has been discovered that providing a thermally conductive dielectric substrate, a plurality of input contacts and a plurality of output contacts supported by the dielectric substrate, and an integrated circuit chip including input terminals and output terminals, the input terminals being electrically connected to the input contacts via a first conductive material, and the output terminals being electrically connected to the output contacts via a second conductive material advantageously provides a thermoelectrically cooled integrated circuit package in which the thermoelectric cooling of the package is proportional to the current draw of the chip.

DETAILED DESCRIPTION

Figure 1:
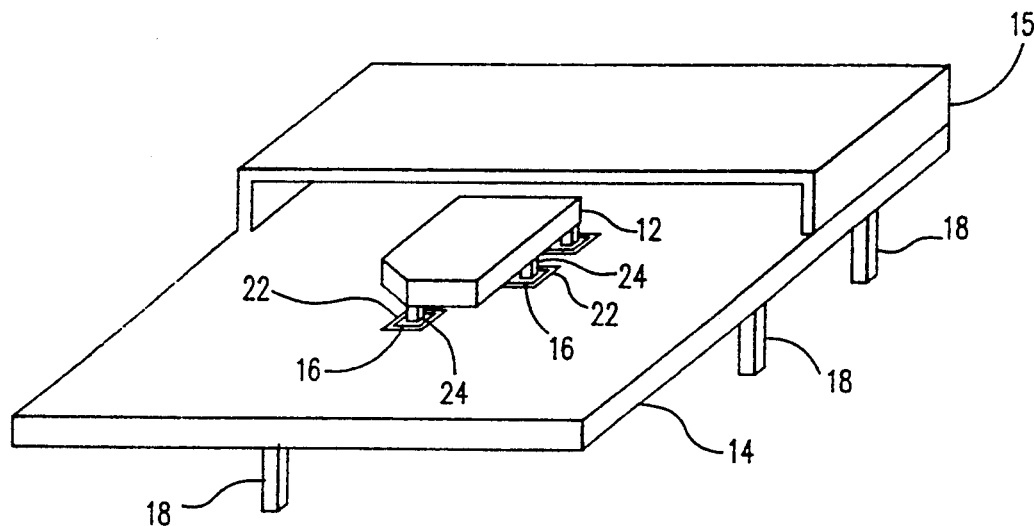
FIG. 1 is a perspective view, partially in section, of an integrated circuit package in accordance with the present invention.

Referring to FIG. 1, integrated circuit package 10 includes integrated circuit chip 12, dielectric substrate 14 and cover 15. Dielectric substrate 14 includes connecting portions 16 which are electrically connected to respective input/output terminals (I/O terminals) 18 via conductors which are passed through channels defined by substrate 14. Integrated circuit chip 12 is electrically and mechanically connected to connecting portions 16 of dielectric substrate 14 via conductive material 20 using a technology similar to controlled collapse chip connections (C-4) connection technology. Descriptions of the C-4 connection technology are set forth in Miller, U.S. Pat. No. 3,429,040, and Merrin et al., Re. 27,934, which are hereby incorporated by reference.

In general, C-4 connection technology uses the surface tension of conductive material 24 to support integrated circuit chip 12 on dielectric structure 14. Dielectric supporting substrate 14 is provided with a plurality of connecting portions 16. The connecting portions 16 are wettable with conductive material. The portions 22 immediately surrounding connecting portions 16 are not wettable with conductive material. A coating of conductive material is then applied to the size-limited connecting portions 16.

Integrated circuit chip 12, which has conductive material contacts 24 extending therefrom, is then positioned on the preselected connecting portions 16. Contacts 24 of chip 12 are placed with flux on the conductive material of connecting portions 16 and chip 12 is held temporarily in place. Substrate 14 and chip 12 are then heated to a temperature at which conductive material 24 melts. The molten conductive material substantially maintains its shape because portions 22, which are immediately adjacent to connecting portions 16, are not wettable with conductive material. The conductive material connection is then allowed to cool; the component is thus electrically connected to the conductive patterns on the dielectric substrate and spaced from the substrate.

Figure 2:
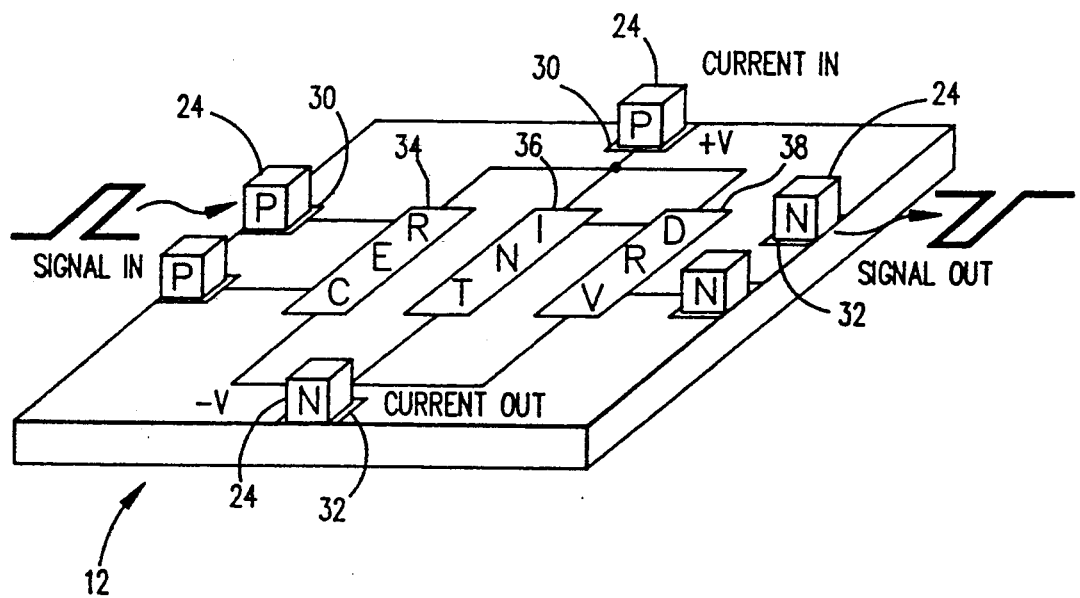
FIG. 2 is a perspective view of the underside of an integrated circuit chip of the FIG. 1 integrated circuit package.

Referring to FIGS. 1 and 2, the conductive material used to connect input terminals 30 of integrated circuit chip 12 to the input connecting portions which are located on substrate 14 is different from that used to connect output terminals 32 of integrated circuit chip 12 to the output connecting portions which are located on substrate 14. More specifically, the conductive material used for input terminals 30 is p-type semiconductor material and the conductive material used for output terminals 32 is n-type semiconductor material.

Input terminals 30 may be either signal input terminals, through which electronic signals are provided to integrated circuit chip 12, or power input terminals, through which current is supplied to integrated circuit chip 12. Output terminals 32 may be either signal output terminals, through which electronic signals are transmitted from integrated circuit chip 12, or power output terminals, from which current is drawn from integrated circuit chip 12. There is a respective connecting portion and conductive material for each terminal. Because the conductive material through which input signals and input current travel is different from the conductive material through which output signals and output current travel, the conductive material thermoelectrically cools integrated circuit chip 12 when signals pass through an input and an output. The thermal energy is transferred from integrated circuit chip 16 to substrate 14 thermoelectrically. The thermal energy is dissipated from substrate 14 via a heat sink or other mechanical means.

More specifically, integrated circuit chip 12 is thermoelectrically cooled in two ways. Firstly, when integrated circuit chip 12 is drawing current (e.g., to power receiver 34, internal logic 36 and driver 38), the conductive material which connects power input and output terminals 30, 32 to connecting portions 16 thermoelectrically cools integrated circuit chip 12. As integrated circuit chip 12 draws more current and thus produces more thermal energy, the thermoelectric cooling effect generated by the different input and output conductive material increases. Conversely, as integrated circuit chip 12 draws less current and thus produces less thermal energy, the thermoelectric cooling effect generated by the different input and output conductive material decreases.

Additionally, when a signal is received through signal input terminal 30 to receiver 34 and transmitted from driver 38 to signal output terminal 32, the conductive material which connects terminals 30, 32 to respective connecting portions of substrate 14 draws thermal energy from integrated circuit chip 12 to substrate 14. This cooling effect increases as more signals are received and transmitted by integrated circuit chip 12 and decreases as fewer signals are received and transmitted by integrated circuit chip 12. Accordingly, when integrated circuit chip 12 is more active (i.e., receives and transmits more signals) and thus generates more thermal energy, the thermoelectric cooling effect increases. Conversely, when integrated circuit chip 12 is less active (i.e., receives and transmits fewer signals) and thus generates less thermal energy, then the thermoelectric cooling effect decreases. Because the conductive material which provides the thermoelectric cooling effect is the same material through which power and signals are supplied to integrated circuit chip 12, there is no need to provide a separate thermoelectric cooler or separate power lines to provide power to a separate thermoelectric coolers.

OTHER EMBODIMENTS

Other embodiments are within the following claims.

For example, the connection technology used to electrically connect integrated circuit chip 12 to I/O terminals 18 may be any technology which allows the input electrical connections to be constructed of dissimilar conductive material from the output electrical connections.

More specifically, the connection technology used may be wire bond technology in which the wires used are constructed of dissimilar materials such as p-type and n-type semiconductor material.

Also, e.g., the ratio of signals received to signals transmitted does not have to be one to one; this ratio merely relates to the efficiency of the thermoelectric cooling.

Also, e.g., multiple chips may be connected to a single substrate.

Figure 3:
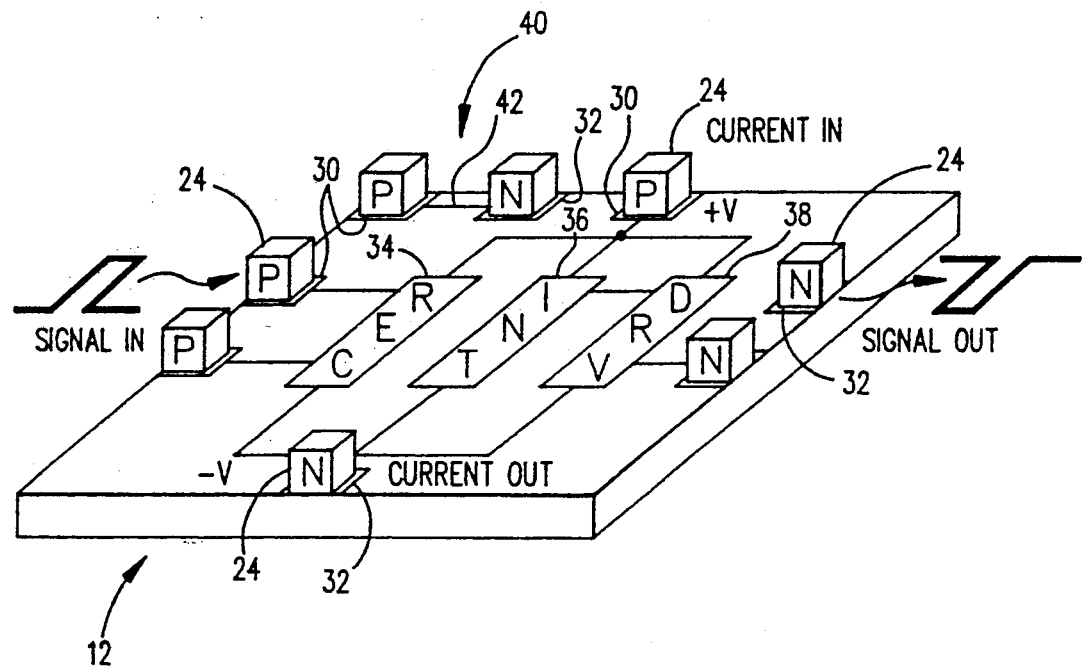
FIG. 3 is a perspective view of an alternate embodiment of an integrated circuit chip in accordance with the present invention.

Also, e.g., referring to FIG. 3, one or more TEC shunts may be added to integrated circuit package 10 to provide thermoelectric cooling. More specifically, TEC shunt 40 is provided by electrically connecting an input terminal 30 to an output terminal 32 via shunt line 42. Input terminal 30 is connected to an input connecting portion via conducting material which is different from that used to connect output terminal 32 to an output connecting portion. A plurality of TEC shunts 40 may be provided to increase the amount of thermoelectric cooling. Because shunt line 42 generates a minimal amount of thermal energy, TEC shunt 40 provides efficient thermoelectric cooling.

Figure 4:
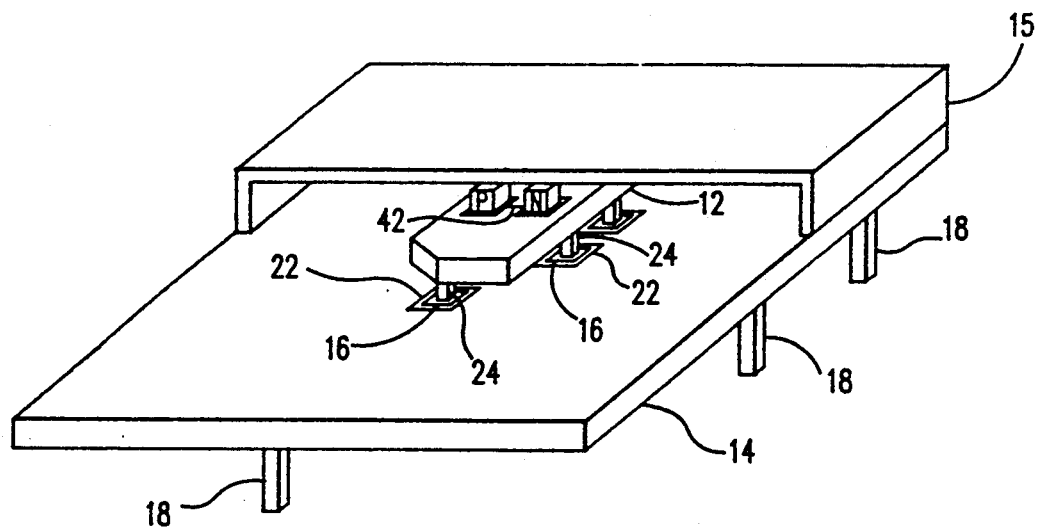
FIG. 4 is a perspective view, partially in section, of an alternate embodiment of an integrated circuit package in accordance with the present invention.

Additionally, referring to FIG. 4, the input and output connecting portions may be located on a heat dissipating device other than substrate 14. Thus, TEC shunt 40 may be connected between integrated circuit chip 12 and a heat dissipating device such as cover 15 or a heat sink.

What is claimed is:

1. A thermoelectrically cooled integrated circuit package comprising
   a thermally conductive dielectric substrate,
   an input connecting portion supported by said dielectric substrate,
   an output connecting portion supported by said dielectric substrate, and
   an integrated circuit chip including an input terminal and an output terminal,
      said input terminal being electrically connected to said input connecting portion via a first conductive material, and
      said output terminal being electrically connected to said output connecting portion via a second conductive material
         said first conductive material and said second conductive material thermoelectrically cooling said integrated circuit chip when a signal passes through said first conductive material and said second conductive material.

2. The integrated circuit package of claim 1 further comprising
   a plurality of input terminals, and
   a plurality of input connecting portions
      said plurality of input terminals being electrically connected to said plurality of input connecting portions via said first conductive material.

3. The integrated circuit package of claim 2 wherein at least one input terminal is a signal input terminal, and
   at least one input connecting portion is a signal input connecting portion.

4. The integrated circuit package of claim 2 wherein at least one input terminal is a power input terminal, and
   at least one input connecting portion is a power input connecting portion.

5. The integrated circuit package of claim 1 further comprising
   a plurality of output terminals, and
   a plurality of output connecting portions
      said plurality of output terminals being electrically connected to said plurality of output connecting portions via said second conductive material.

6. The integrated circuit package of claim 5 wherein at least one output terminal is a signal output terminal,
   at least one output connecting portion is a signal output connecting portion.

7. The integrated circuit package of claim 5 wherein at least one output terminal is a power output terminal, and at least one output connecting portion is a power output connecting portion.

8. The integrated circuit package of claim 1 wherein
said first conductive material is a first semiconductor material, and
said second conductive material is a second semiconductor material.

9. The integrated circuit package of claim 8 wherein
said first semiconductor material is p-type material, and
said second semiconductor material is n-type material.

10. The integrated circuit package of claim 2 wherein
at least one input terminal is a shunt input terminal, and
at least one input connecting portion is a shunt input connecting portion.

11. The integrated circuit package of claim 10 wherein
as least one output terminal is a shunt output terminal, and
at least one output connecting portion is a shunt output connecting portion.

12. The integrated circuit package of claim 11 wherein
said shunt input terminal is electrically connected to said shunt output terminal via a shunt line.

13. A thermoelectrically cooled integrated circuit package comprising
a heat dissipating material,
an input connecting portion supported by said heat dissipating material,
an output connecting portion supported by said heat dissipating material, and
an integrated circuit chip including an input terminal and an output terminal,
said input terminal being electrically connected to said input connecting portion via a first conductive material, and
said output terminal being electrically connected to said output connecting portion via a second conductive material
said first conductive material and said second conductive material thermoelectrically cooling said integrated circuit chip when a signal passes through said first conductive material and said second conductive material.

14. The integrated circuit package of claim 13 wherein
at least one input terminal is a shunt input terminal, and
at least one input connecting portion is a shunt input connecting portion.

15. The integrated circuit package of claim 14 wherein
as least one output terminal is a shunt output terminal, and
at least one output connecting portion is a shunt output connecting portion.

16. The integrated circuit package of claim 15 wherein
said shunt input terminal is electrically connected to said shunt output terminal via a shunt line.

17. The integrated circuit package of claim 13 wherein
said heat dissipating material includes a thermally conductive dielectric substrate.

18. The integrated circuit package of claim 13 wherein
said heat dissipating material includes a cover covering said integrated circuit chip.

19. The integrated circuit package of claim 13 wherein
said heat dissipating material includes a cover covering said integrated circuit chip.

20. The integrated circuit package of claim 13 wherein
said heat dissipating material includes a heat sink.

* * * * *